United States Patent [19]
D'Ariano

[11] Patent Number: 4,774,419
[45] Date of Patent: Sep. 27, 1988

[54] TRANSFORMER COUPLED DRIVE CIRCUIT

[75] Inventor: Emilio F. D'Ariano, Vincentown, N.J.

[73] Assignee: General Electric Company, Morrestown, N.J.

[21] Appl. No.: 65,735

[22] Filed: Jun. 24, 1987

[51] Int. Cl.⁴ .......................... H03K 3/26; H03K 3/45; H03K 17/56
[52] U.S. Cl. .................................. 307/270; 307/255; 307/314; 307/247.1
[58] Field of Search ................ 307/254, 255, 270, 314, 307/247.1

[56] References Cited

U.S. PATENT DOCUMENTS

| 4,176,304 | 11/1979 | Scott | 315/411 |
| 4,227,123 | 10/1980 | Dietz | 315/397 |
| 4,349,752 | 9/1982 | Forte | 307/314 |
| 4,561,027 | 12/1985 | Sita et al. | 360/39 |
| 4,629,971 | 12/1986 | Kirk | 307/270 |
| 4,656,414 | 4/1987 | Morund | 307/270 |

Primary Examiner—Stanley D. Miller
Assistant Examiner—B. P. Davis
Attorney, Agent, or Firm—Clement A. Berard; William H. Meise

[57] ABSTRACT

A transformer includes a secondary winding coupled to a load which may be the source and gate of a FET. The primary winding of the transformer is connected to a pair of switching transistors, a first of which couples the winding across B+ during a positive portion of the drive cycle, and a second of which couples a charged capacitor across the primary during a second, negative portion of the drive cycle. The duty cycle defined by the positive and negative portions of the cycle varies. In order to prevent excess current during saturation of the core for duty cycles other than 50%, the capacitor is sized to supply only enough voltage and current to reset the core.

17 Claims, 3 Drawing Sheets

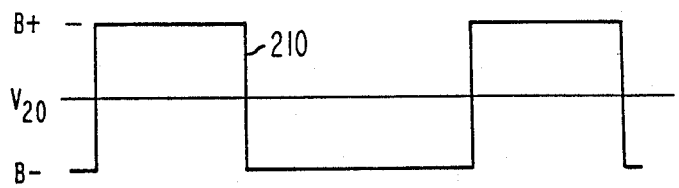
Fig. 2a
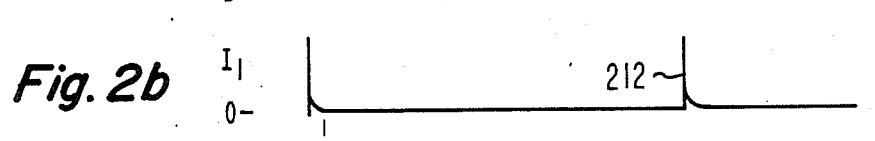
Fig. 2b
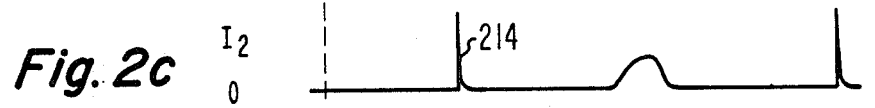
Fig. 2c
Fig. 2d
Fig. 2e
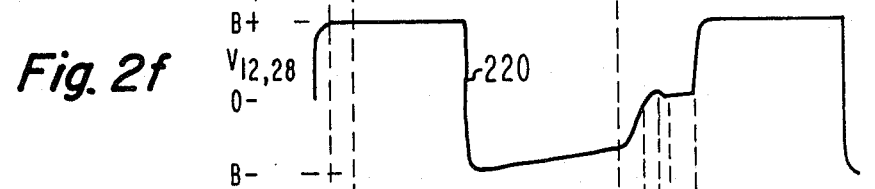
Fig. 2f
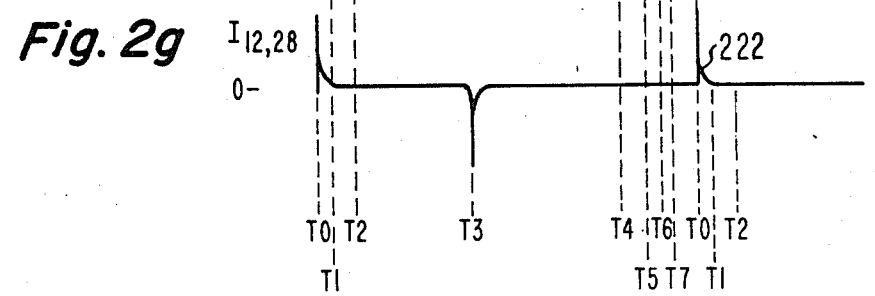
Fig. 2g

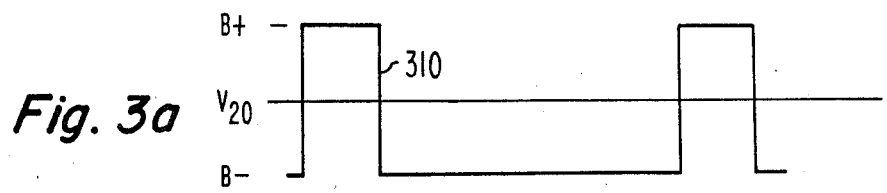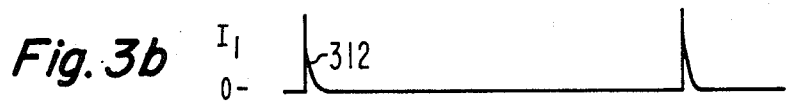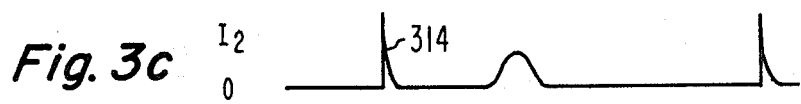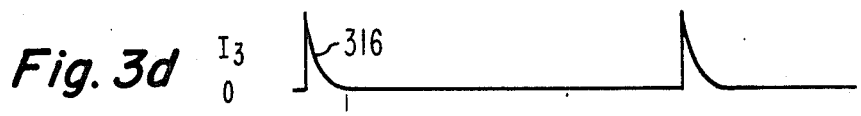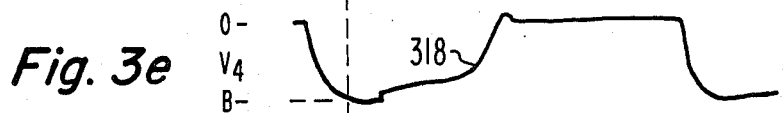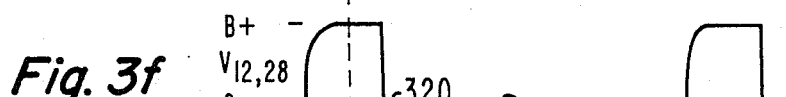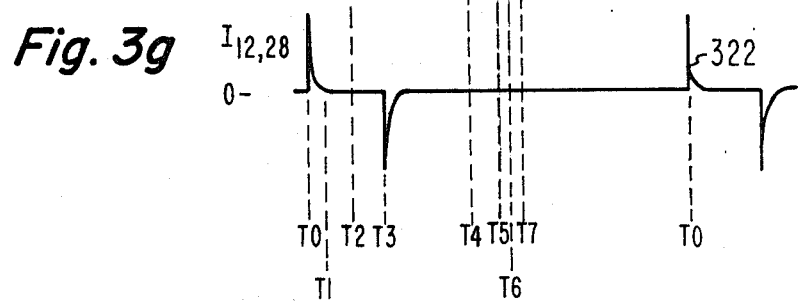

ic drive circuits, and in particular to such drive circuits in which the peak value of the voltage coupled by the transformer to the load remains substantially constant notwithstanding variations in the duty cycle of the drive waveform.

TRANSFORMER COUPLED DRIVE CIRCUIT

BACKGROUND OF THE INVENTION

This invention relates to transformer coupled drive circuits, and in particular to such drive circuits in which the peak value of the voltage coupled by the transformer to the load remains substantially constant notwithstanding variations in the duty cycle of the drive waveform.

It is often desirable to couple a voltage to a load, while maintaining conductive isolation between the load and the source of the voltage. This may be accomplished by the use of a series blocking capacitor, or by the use of transformer coupling, both of which ordinarily provide the type of coupling known as alternating-current or AC coupling.

In transformer coupling with a series blocking capacitor of repetitive signals having a constant duty cycle, the signal appearing at the load side of the capacitor and transformer combination maintains a constant peak-to-peak value. When signals of variable duty cycle are coupled by this combination, the peak-to-peak value of the alternating voltage or current on the line or load side of the continues to be the same as the peak-to-peak value on the source side, but the peak magnitude changes on the load side in such a manner as to maintain an average value of zero volts. This change in peak value may be undesirable. The changes in peak value may be eliminated by circuits known as direct current (D.C.) restorers. Such D.C. restorers may include capacitors charged by rectified signal. It may take several cycles of operation before the D.C. restorer capacitor charges to the correct value, which may be undesirable for coupling short bursts of signal of variable duty cycle if a constant peak value must be maintained.

It may be desired to drive the gate of a power field-effect transistor (FET) of the metal-oxide-semiconductor type (MOSFET) with a signal. The gate-to-source capacitance of such a FET is substantial. If fast turn-on or turn-off transition times are required, the gate-to-source capacitance requires that the drive source have a low impedance, so that it can supply the relatively large currents required to quickly charge and discharge the gate-to-source capacitance.

The secondary winding of a transformer can provide the low drive impedance required for driving the gate of a power FET. In order to provide both fast charge and fast discharge, bidirectional drive must be provided. However, if a series blocking capacitor is not provided, and the duty cycle of the drive waveform is other than 50%, the average value of the primary and secondary current may be non-zero, and magnetic core of the transformer may not be reset, i.e., the core may saturate. In a saturated state of the core, the mutual inductance of the transformer windings decreases, and undesirably large currents may flow therethrough. Also, the voltage coupled to the load may decrease.

SUMMARY OF THE INVENTION

A drive circuit for driving a load with first and second voltages during first and second alternate intervals, respectively, of a recurrent operating cycle, includes first and second switches coupled for alternately applying first and second voltages across the primary winding of a transformer. The second voltage is provided by a capacitor, which is charged to a peak value of the second voltage during the period of conduction of the first switch. At duty cycles for which transformer saturation occurs during conduction of the second switch, the second voltage progressively decreases as the capacitor discharges, so that reset of the transformer occurs without drawing large amounts of saturation current.

DESCRIPTION OF THE DRAWING

FIGS. 1a, 1b and 1c, referred to together as FIG. 1, illustrate in FIG. 1a a schematic diagram of an embodiment of the invention, and in FIGS. 1b and 1c illustrate alternate connections for one of the components of FIG. 1a;

FIGS. 2a–2g and 3a–3g illustrate amplitude-time waveforms of various voltages and currents occurring in the arrangement of FIG. 1 during operation at two different duty cycles of the drive waveform.

DESCRIPTION OF THE INVENTION

Figure 1A:
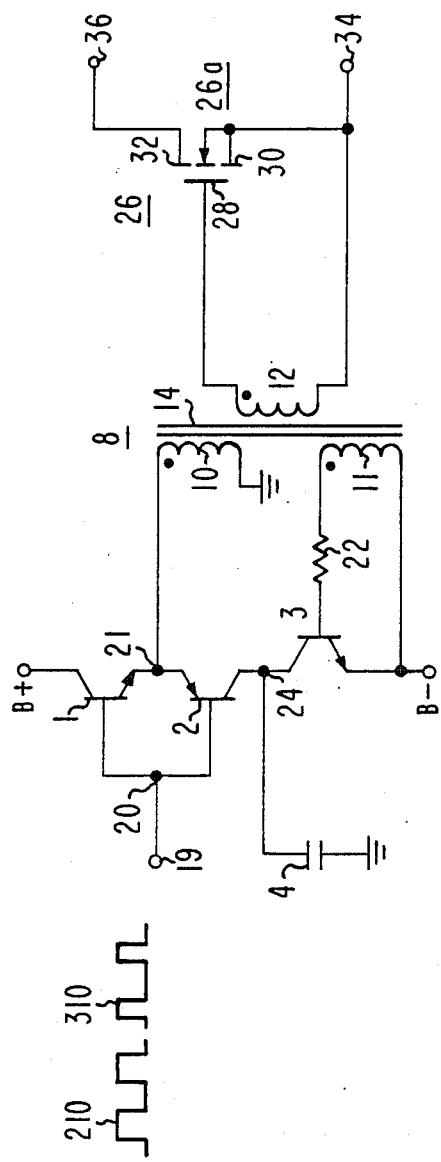

In FIG. 1a, drive voltage waveforms illustrated as 210 and 310 are supplied to an input terminal 19. Waveforms 210 and 310 are described in more detail below. From input terminal 19, the drive voltage is applied by way of a node 20 in parallel to the base electrode (base) of a bipolar NPN first transistor 1 and to the base of a bipolar PNP second transistor 2. The collector electrode (collector) of transistor 1 is connected to a source B+ of positive voltage, and the emitter electrode (emitter) of transistor 1 is connected to a node 21. When the drive voltage 210 or 310 applied to node 19 is at a sufficiently large positive voltage, such as the maximum positive voltage, the base-emitter junction of transistor 1 becomes forward-biased, and the collector-emitter path is rendered conductive. When the drive voltage applied to terminal 19 is at a sufficiently large negative value, such as the maximum negative value, the base-emitter junction of transistor 1 is reverse-biased, and the collector-emitter path of transistor 1 becomes open-circuited. Thus, transistor 1 may be considered to be a switch having a conduction path between the collector and emitter which is controlled by the voltage applied to the base.

Second transistor 2 has its emitter connected to node 21 and its base connected to node 20. The collector of transistor 2 is connected to a further node 24, which is connected to an electrode of a capacitor 4. The other electrode of capacitor 4 is connected to a point of reference potential, which is illustrated in FIG. 1a as ground. Since transistor 2 is a PNP transistor, its collector-emitter conductive path is rendered conductive when the voltage at input terminal 19 is at its maximum negative value, and the collector-emitter conductive path is rendered nonconductive by a maximum positive potential applied to input terminal 19. Thus, transistor 2 may be considered to be a switch which is controlled for conduction alternately with transistor 1, i.e., switch (transistor) 2 conducts during those intervals in which switch (transistor) 1 is nonconductive, and vice versa.

A transformer 8 includes a primary winding 10, a first end of which is grounded. The second end of primary winding 10 is connected to node 21, and is driven under control of the alternate conduction of transistors 1 and 2. Transformer 10 includes a core illustrated as 14. A first secondary winding 11 of transformer 8 has a first end connected to a source B− of negative potential. A second end of secondary winding 11 is identified by a dot, to indicate the polarity of the voltage induced thereacross by a corresponding polarity applied to the dotted end of primary winding 10. The dotted end of secondary winding 11 is connected by way of a current limiting resistor 22 to the base of a bipolar NPN third transistor 3.

Transistor 3 has its emitter connected to source B−, and its collector connected to node 24. Transistor 3 may be considered to be a switch including a collector-to-emitter path controlled by the voltage applied to the base electrode. The base of transistor 3 is made positive relative to its emitter by a voltage induced in secondary winding 11 during those intervals in which transistor 1 is conductive and applies B+ voltage to the dotted end of primary winding 12. When the base of transistor 3 is made positive relative to its emitter, its collector-emitter path is rendered conductive.

Transformer 8 includes a second secondary winding 12. A load, designated generally as 26, is coupled to secondary winding 12. Load 26 as illustrated includes the gate electrode 28 of a FET designated generally as 26a. Gate electrode 28 is connected to the dotted end of secondary winding 12. Load 26 also includes a source electrode 30 of FET 26a. The second end of secondary winding 12 is connected to source electrode 30. FET 26a also includes a drain electrode 32. Further terminals 34 and 36 are provided for coupling the source-to-drain conductive path of FET 26a to a utilization apparatus, not illustrated.

In operation, during the positive-going extremes of input voltage waveforms 210 (during times $T_0$-$T_3$ of FIG. 2a), the collector-to-emitter path of transistor 1 is rendered conductive, thereby applying B+ voltage to the dotted end of primary winding 10. During the positive-going portion of the input voltage, transistor 2 is rendered nonconductive. The B+ voltage applied to the dotted end of primary winding 10 induces a positive output voltage at the dotted end of secondary winding 12 and at gate 28 of FET 26a relative to source 30, as illustrated by voltage 220 of FIG. 2f in the interval $T_0$-$T_3$. The B+ voltage applied to the dotted end of primary winding 10 also induces a positive voltage at the dotted end of secondary winding 11 and at the base of transistor 3 relative to source B−, thereby rendering the collector-to-emitter path of transistor 3 conductive in the interval $T_0$-$T_3$.

Immediately before time $T_0$ at which drive waveform is applied to terminal 10, the gate-to-source capacitance of FET 26a is uncharged (not charged). At time $T_0$, when transistor 1 becomes conductive, a surge of current occurs through its collector-to-emitter conductive path and through primary winding 10, as illustrated in the interval $T_0$-$T_1$ by current waveform 212 of FIG. 2b. The surge of primary current is transformed in accordance with the turns ratio of windings 10 and 12, as known in the art, and supplies the gate current (current waveform 222 of FIG. 2g) required to produce the desired gate drive voltage. As illustrated by voltage waveform 220 of FIG. 2f, the desired drive voltage waveform for the gate-to-source voltage in the interval $T_0$-$T_3$ is a positive pulse of amplitude B+. Since the peak output voltage (B+) equals the primary-side peak voltage, the turns ratio of windings 10 and 12 (FIG. 1a) is established as being 1:1 in the particular illustrated embodiment.

In the interval between times $T_1$ and $T_3$ no further primary current is required to maintain voltage 220 on the secondary side of transformer 8, because the charged gate-to-source capacitance maintains the voltage, and the gate-to-source resistance is high such that negligible current is drawn. The current through transistor 1 and primary winding 10 has a low, but increasing magnitude, representing the magnetizing current of transformer 8. This current is preferably small and is not illustrated in FIG. 2.

Immediately before time $T_0$, capacitor 4 is substantially discharged or uncharged (has no relative voltage between its electrodes), as illustrated by voltage waveform 218 of FIG. 2e. Transistor 3 becomes conductive in the interval $T_0$-$T_3$, as mentioned. When conductive, the collector-emitter path of transistor 3 allows current to flow. A surge of current flows through transistor 3 in the interval $T_0$-$T_2$ as illustrated by waveform 216 of FIG. 2d, thereby allowing capacitor 4 to charge to the B− voltage. The charging current through capacitor 4 and transistor 2 decreases to zero at time $T_2$, as illustrated by current waveform 216 of FIG. 2d. Those skilled in the art understand that current 216 theoretically never reaches zero, but as a practical matter reaches zero in about five time constants. Since one end of capacitor 4 is grounded, node 24 (FIG. 1a) assumes a voltage of B− at time $T_2$. In the interval between time $T_2$ and later time $T_3$, transistor 3 remains conductive, but no current flows because capacitor 4 is already fully charged to B−. Charging of capacitor 4 takes a longer time (interval $T_0$-$T_2$) than charging of the gate-to-source capacitance of FET 26a ($T_0$-$T_1$) because capacitor 4 has a greater capacitance, and the RC time constant is therefore larger.

In the interval between times $T_2$ and $T_3$ of FIG. 2, transistor 1 (FIG. 1) carries a small, but increasing magnetizing current (not illustrated by waveform 212 of FIG. 2b), to maintain the desired B+ output voltage (220 of FIG. 2f) from secondary winding 12 and a voltage from secondary winding 10. No current is drawn from secondary winding 12, however, as illustrated by current waveform 222 of FIG. 2g, because the gate 28-to-source 30 capacitance of FET 26a is fully charged. Transistor 2 remains nonconductive, so no current flows therethrough (current waveform 214 of FIG. 2c). Transistor 3 remains conductive due to base current drawn from secondary winding 11, but carries no collector-to-emitter current (waveform 216 of FIG. 2d), since capacitor 4 is fully charged (voltage waveform 218 of FIG. 2e).

At time $T_3$, drive voltage 210 applied to input terminal 19 (FIG. 1) makes a transition to a negative voltage, illustrated as B− in FIG. 2a. This reverse-biases the base-emitter junction of transistor 1 and turns it OFF, and forward-biases the base-emitter junction of transistor 2, thereby turning it ON. The dotted end of primary winding 10 becomes effectively disconnected from B+ by the OFF condition of transistor 1, and become effectively connected to the B− voltage at node 24 by the ON condition of transistor 2.

Also at time $T_3$, the B− voltage applied by conductive transistor 2 to the dotted end of primary winding 10 makes the dotted end of secondary winding 11 relatively negative, which turns transistor 3 OFF. With transistor 3 OFF, the voltage at node 24 is established by the voltage across capacitor 4, which in turn is established by the charge of capacitor 4.

At the instant $T_3$ at which transistor 2 becomes conductive, a surge of current flows therethrough, as illustrated by the surge portion of current waveform 214 of FIG. 2c, as current is drawn by primary winding 10 to reverse the voltage applied by secondary winding 12 to load 26 (voltage waveform 220 of FIG. 2f) and to provide the current flow in secondary winding 12, as illustrated by current waveform 222 of FIG. 2g, required to discharge the gate-to-source capacitance of FET 26a and to recharge it in the opposite polarity. The rush of current through transistor 2 and into primary winding 10 at time $T_3$ and immediately thereafter is drawn from capacitor 4, since transistor 3 is OFF. The current flow through capacitor 4 at time $T_3$ and immediately thereafter causes a slight discharge which is illustrated in voltage waveform 218 of FIG. 2e.

In the interval between times $T_3$ and $T_4$, no current is drawn by load 26 from secondary winding 12 and no current is drawn by the reverse-biased base-emitter junction of transistor 3 from secondary winding 11, so only magnetizing current is drawn by primary winding 10 from capacitor 4 by way of conductive transistor 2. This current progressively discharges capacitor 4, thereby reducing the negative voltage thereacross (waveform 218 of FIG. 2e). At time $T_4$, capacitor 4 retains a substantial charge, and has substantial voltage thereacross.

Core 14 of transformer 8 is dimensioned so that it is on the verge of magnetic saturation when the supply voltage (either B+ or B−) is applied to primary winding 10 for a duration equal to one-half the duration of a complete cycle of drive waveform 210 of FIG. 2a. The duration of one complete cycle, as illustrated in FIG. 2, is the interval $T_0$—$T_0$. When the duty cycle of drive waveform 210 is 50%, the waveform assumes the B+ value for one-half of the duration of a complete cycle, and similarly assumes the value B− for the other half of the cycle. With a 50% duty cycle, therefore, the transformer is on the verge of saturation at the end of each half-cycle of drive. In FIG. 2, the duty cycle is not 50%. The duration of the positive half-cycle of drive is about 40%, and therefore the duration of the negative half-cycle of drive is about 60% of the duration of the complete cycle. The term half-cycle is used generally, even though the positive and negative positions of the cycle have unequal durations.

Since the positive half-cycle as illustrated in FIG. 2 has a duration of less than half of a complete cycle, core 14 does not become saturated during the positive half-cycle of operation (time $T_0$–$T_3$). However, the negative half-cycle of drive waveform 210 of FIG. 2a is greater than one-half cycle of operation (time $T_3$–$T_0$). Consequently, the core begins to saturate at a time illustrated in FIG. 2 as time $T_4$. When the core is saturated, the self- and mutual inductances of the transformer windings decrease. In effect, their impedance drops. Consequently, the current flow attributable to an applied voltage increases. After time $T_4$, therefore, the current flow from capacitor 4 through transistor 2 and primary winding 11 progressively increases. As a result, capacitor 4 discharges more quickly after time $T_4$ than before time $T_4$. At time $T_5$, the voltage across capacitor 4 decreases to zero. When the voltage across capacitor 4 decreases to zero, the voltage at node 24 is also zero. Under this condition, there is no voltage applied, and one might expect the primary winding current to decrease to zero.

However, current continues to flow through a resonant circuit formed by the residual inductance associated with primary winding 10, capacitor 4, and transistor 2 from time $T_5$ to time $T_7$, as illustrated by current waveform 214 of FIG. 2c. In the interval $T_5$–$T_7$, the voltage (220 of FIG. 2f) produced by secondary winding 12 decreases. At time $T_7$, the resonant current becomes zero, capacitor 4 is discharged, as illustrated by voltage waveform 218 of FIG. 2e, and the output voltage of transformer 8 at secondary winding 12 becomes zero. The output voltage remains zero until the next time $T_0$, representing the beginning of the next half-cycle of operation.

As described, the first or positive half-cycle of drive voltage is always short enough so that saturation of the transformer cannot occur, provided that it has been reset during the previous negative half-cycle. The second half-cycle may be long enough for saturation to occur, but the magnetizing current is drawn from a capacitor which supplies only sufficient voltage and current to reset the transformer magnetization.

FIGS. 3a–3g illustrate the same amplitude-time waveforms of FIGS. 2a–2g, respectively, but for a duty cycle of about 25% rather than 40%. The waveforms of FIGS. 3a–3g are represented by the same reference numerals as the corresponding waveforms of FIGS. 2a–2g, but in the 300 series rather than in the 200 series. In FIG. 3, the duration of the first or positive half-cycle of drive ($T_0$–$T_3$) is of short duration, so no saturation occurs. The following period ($T_3$–$T_0$) of negative drive voltage 310 (FIG. 3a) causes a negative output voltage from secondary winding 12, as illustrated by waveform 320 in the interval $T_3$–$T_4$, followed by a period of saturation and discharge of capacitor 4 (time $T_4$–$T_6$), followed by a relatively long quiescent period (time $T_7$–$T_0$).

Figure 1C:
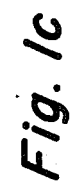
Figure 1B:

Other embodiments of the invention will be apparent to those skilled in the art. For example, the electrode of capacitor 4 remote from node 24 may be returned to B−, as illustrated in FIG. 1b, or to B+, as illustrated in FIG. 1c, rather than to ground. FETs may be used instead of bipolar transistors 1, 2, and/or 3. If transistors 1 and 3 are changed from NPN to PNP, and transistor 2 from PNP to NPN, and the connections of B+ and B− are reversed, the circuit will operate in a similar fashion to that described. A resistor may be coupled between gate 28 and source 30 of FET 26a.

What is claimed is:

1. A drive circuit for driving a high impedance load with first and second voltages during first and second alternate intervals of a recurrent drive cycle of selectable duty cycle, at least one of said first and second voltages remaining substantially constant notwithstanding changes in said duty cycle, said drive circuit comprising:

a transformer having a magnetic core, and including a primary winding including first and second ends, a first secondary winding including first and second ends, and a second secondary winding, said second secondary winding being coupled to said high impedance load;

sources of first and second potential relative to a source of reference potential, said source of reference potential being coupled to said first end of said primary winding, and said source of second potential being coupled to said first end of said first secondary winding;

controllable first switch means including a control electrode and a controlled current path, coupled for being driven for rendering said controlled current path conductive during said first interval of each of said recurrent cycles, said controlled current path of said first switch means being coupled between said source of first potential and said second end of said primary winding for, when conductive, causing current flow in a first direction through said primary winding for inducing a positive voltage at said second end of said first secondary winding relative to said first end of said first secondary winding;

controllable second switch means including a control electrode and a controlled current path extending between first and second electrodes, said control electrode of said second switch means being directly connected to said control electrode of said first switch means at a node for being driven for conduction during said second intervals of each of said recurrent cycles, said first electrode of said second switch means being directly connected to said second end of said primary winding for, when conductive, carrying current flow in a second direction through said primary winding for inducing a negative voltage at said second end of said first secondary winding, whereby duty cycles in which said second controllable switch means is conductive for more than half said duration of said cycle and might result in saturation of said core, and might therefore undesirably result in drawing substantial currents from said source of second potential;

controllable third switch means including a controlled current path extending between said second electrode of said second switch means and said source of second potential and also including a control electrode coupled to said second end of said first secondary winding for rendering said controlled current path of said third switch means conductive in response to a positive voltage induced at said second end of said first secondary winding, whereby said third switching means is conductive during those intervals in which said first switch means is conductive, and is nonconductive during those intervals in which said second switch means is conductive;

charge storage means including first and second electrodes, said first electrode of said charge storage means being coupled to said second electrode of said second switch means, and said second electrode of said charge storage means being coupled to one of said reference, first and second potentials, for establishing said second potential at said first electrode of said charge storage means during those intervals in which said third switch means is conductive, whereby during those intervals in which said second switch means is conductive, said current flow in a second direction through said primary winding also flows through said charge storage means, and said second potential established at said first electrode of said charge storage means approaches said reference potential as a result of said current flow through said charge storage means, thereby limiting the current flow through said primary winding during the latter portions of said second intervals of said recurrent cycle.

2. A drive circuit according to claim 1 wherein said first, second and third switch means comprise bipolar transistors.

3. A drive circuit according to claim 1 wherein said charge storage means comprises a capacitor.

4. A drive circuit according to claim 1 wherein said second electrode of said charge storage means is coupled to said source of reference potential.

5. A drive circuit according to claim 4 wherein said charge storage means comprises a capacitor.

6. A drive circuit according to claim 1 wherein said second electrode of said charge storage means is coupled to said source of first potential.

7. A drive circuit according to claim 1 wherein said second electrode of said charge storage means is coupled to said source of second potential.

8. A drive circuit for the gate of a field effect transistor including gate and source electrodes, said drive circuit comprising:
    sources of positive and negative potential relative to a source of reference potential;
    a transformer including a magnetic core, a primary winding including a first end coupled to said source of reference potential and also including a second end, a first secondary winding, and a second secondary winding coupled to the gate and source electrodes of the field effect transistor;
    an NPN first bipolar transistor including a collector coupled to said source of positive potential, an emitter coupled to said second end of said primary winding, and a base coupled at a node for receiving drive signals;
    a capacitor including a first electrode coupled to one of said sources of potential, and also including a second electrode;
    a PNP second transistor including an emitter coupled to said second end of said primary winding, a collector coupled to said second electrode of said capacitor, and a base coupled at said node for receiving said drive signals;
    an NPN third transistor including a collector coupled to said second electrode of said capacitor, an emitter coupled to said source of negative potential and to said first end of said first secondary winding, and a base coupled to said second end of said first secondary winding.

9. A drive circuit according to claim 8 wherein said first electrode of said capacitor is coupled to said source of reference potential.

10. A drive circuit according to claim 8 wherein said first electrode of said capacitor is coupled to said source of positive potential.

11. A drive circuit according to claim 8 wherein said first electrode of said capacitor is coupled to said source of negative potential.

12. A drive circuit for a load, comprising:
    a transformer including a primary winding and also including a secondary winding coupled across the load;
    sources of positive and negative potential;
    a capacitor;
    controllable means for recurrently charging said capacitor toward said negative potential;
    first switch means coupled to said primary winding and to said source of positive potential for coupling said source of positive potential to said primary winding in response to a first portion of an input signal;
    second switch means coupled to said primary winding and to said capacitor for coupling said capacitor across said primary winding in response to a second portion of said input signal;

coupling means coupled to said first switch means and to said controllable means for enabling said controllable means during conduction of said first switch means and for disabling said controllable means during nonconduction of said first switch means;

said coupling means comprising a further secondary winding of said transformer, and said controllable means comprising further switch means coupled to said source of negative potential, said further secondary winding and said capacitor.

13. A circuit according to claim 12 wherein said further secondary winding includes first and second ends, and said further switch means includes a control electrode coupled to said first end of said further secondary winding, and also includes a controlled current path coupled to said source of negative potential and to said capacitor.

14. A circuit according to claim 13 wherein:

said capacitor includes a first electrode coupled to one of said sources of potential and also includes a second electrode;

said controlled current path is defined between first and second electrodes, said first electrode of said controlled current path is coupled to said source of negative potential and to said second end of said further secondary winding, and said second electrode of said controlled current path is coupled to said second electrode of said capacitor.

15. A circuit according to claim 14 wherein said first electrode of said capacitor is coupled to said source of reference potential.

16. A circuit according to claim 14 wherein said first electrode of said capacitor is coupled to said source of negative potential.

17. A circuit according to claim 14 wherein said first electrode of said capacitor is coupled to said source of positive potential.

* * * * *